(12) United States Patent
Zhang

(10) Patent No.: US 8,468,489 B2
(45) Date of Patent: Jun. 18, 2013

(54) COMPUTER AIDED DESIGN SYSTEM AND METHOD

(75) Inventor: Miao-Ling Zhang, Shenzhen (CN)

(73) Assignees: Hong Fu Jin Precision Industry (ShenZhen Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 4 days.

(21) Appl. No.: 13/163,695

(22) Filed: Jun. 19, 2011

(65) Prior Publication Data

US 2012/0079444 A1 Mar. 29, 2012

(30) Foreign Application Priority Data

Sep. 28, 2010 (CN) .......................... 2010 1 0294978

(51) Int. Cl.
*G06F 17/50* (2006.01)
(52) U.S. Cl.
USPC ........... 716/139; 716/102; 716/105; 716/110; 716/111; 716/123; 716/137
(58) Field of Classification Search
USPC ................. 716/102, 105, 110, 111, 123, 137, 716/139
See application file for complete search history.

(56) References Cited

U.S. PATENT DOCUMENTS

| | | | | |
|---|---|---|---|---|
| 4,829,446 A | * | 5/1989 | Draney | 716/55 |
| 5,781,447 A | * | 7/1998 | Gerdes | 716/103 |
| 6,173,433 B1 | * | 1/2001 | Katoh et al. | 716/122 |
| 6,298,468 B1 | * | 10/2001 | Zhen | 716/122 |
| 6,353,806 B1 | * | 3/2002 | Gehlot | 703/21 |
| 6,449,761 B1 | * | 9/2002 | Greidinger et al. | 716/122 |
| 6,735,756 B1 | * | 5/2004 | Linn et al. | 716/116 |
| 6,785,873 B1 | * | 8/2004 | Tseng | 716/102 |
| 6,907,589 B2 | * | 6/2005 | Frank et al. | 716/112 |
| 7,096,439 B2 | * | 8/2006 | Tsai et al. | 716/52 |
| 7,137,088 B2 | * | 11/2006 | Frank et al. | 716/115 |
| 7,240,318 B2 | * | 7/2007 | Ito et al. | 716/112 |
| 7,257,793 B2 | * | 8/2007 | Okano et al. | 716/139 |
| 7,409,666 B2 | * | 8/2008 | Almeida et al. | 716/137 |
| 7,441,220 B2 | * | 10/2008 | Hetzel et al. | 716/135 |
| 7,926,012 B1 | * | 4/2011 | Parimi et al. | 716/106 |
| 2008/0005714 A1 | * | 1/2008 | Furukawa | 716/11 |
| 2008/0134121 A1 | * | 6/2008 | Nakamura | 716/11 |
| 2010/0205575 A1 | * | 8/2010 | Arora et al. | 716/11 |
| 2011/0061039 A1 | * | 3/2011 | Kumagai et al. | 716/126 |
| 2011/0191725 A1 | * | 8/2011 | Oberai | 716/52 |

\* cited by examiner

*Primary Examiner* — Helen Rossoshek
(74) *Attorney, Agent, or Firm* — Altis Law Group, Inc.

(57) ABSTRACT

A computer aided design system comprises a dividing module, a storage, an interface creating module, a selecting module, and a display module. The dividing module divides the names into groups according to a predetermined rule. The group comprises a plurality of the targets set on the different layers. The storage records the relationship between the groups and the targets. The interface creating module creates a user interface base on the groups and selects at least one group in the same user interface from the operation of the user. The selecting module selects targets according to the selected groups. The display module displays the selected targets.

20 Claims, 3 Drawing Sheets

COMPUTER AIDED DESIGN SYSTEM AND METHOD

BACKGROUND

1. Technical Field

The present disclosure relates to printed circuit board (PCB) layout systems, particularly, a PCB layout system capable of selecting targets set on different layers of the PCB layout design.

2. Description of Related Art

When designing layouts for electronic systems using software, the design of the printed circuit board (PCB) includes a plurality of layers. Each of the layers includes a number of elements, such as electronic components, holes, and routes, and corresponds to one user interface to list the elements. Therefore, when a user wants to check targets set on different layers, the user has to use the different interfaces respectively to select the targets on each layer one by one. It is complicated and time consuming.

Therefore, there is room for improvement in the art.

BRIEF DESCRIPTION OF THE FIGURE

Many aspects of the embodiments can be better understood with reference to the following drawings. The components in the drawings are not necessarily drawn to scale, the emphasis instead being placed upon clearly illustrating the principles of the PCB layout system and method thereof. Moreover, in the drawings, like reference numerals designate corresponding parts throughout the several views.

DETAILED DESCRIPTION

In general, the word "module," as used herein, refers to logic embodied in hardware or firmware, or to a collection of software instructions, written in a programming language, for example, Java, C, or Assembly. One or more software instructions in the modules may be embedded in firmware, such as an EPROM. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage system. Embodiments of the present disclosure will now be described in detail with reference to the drawings.

Figure 1:
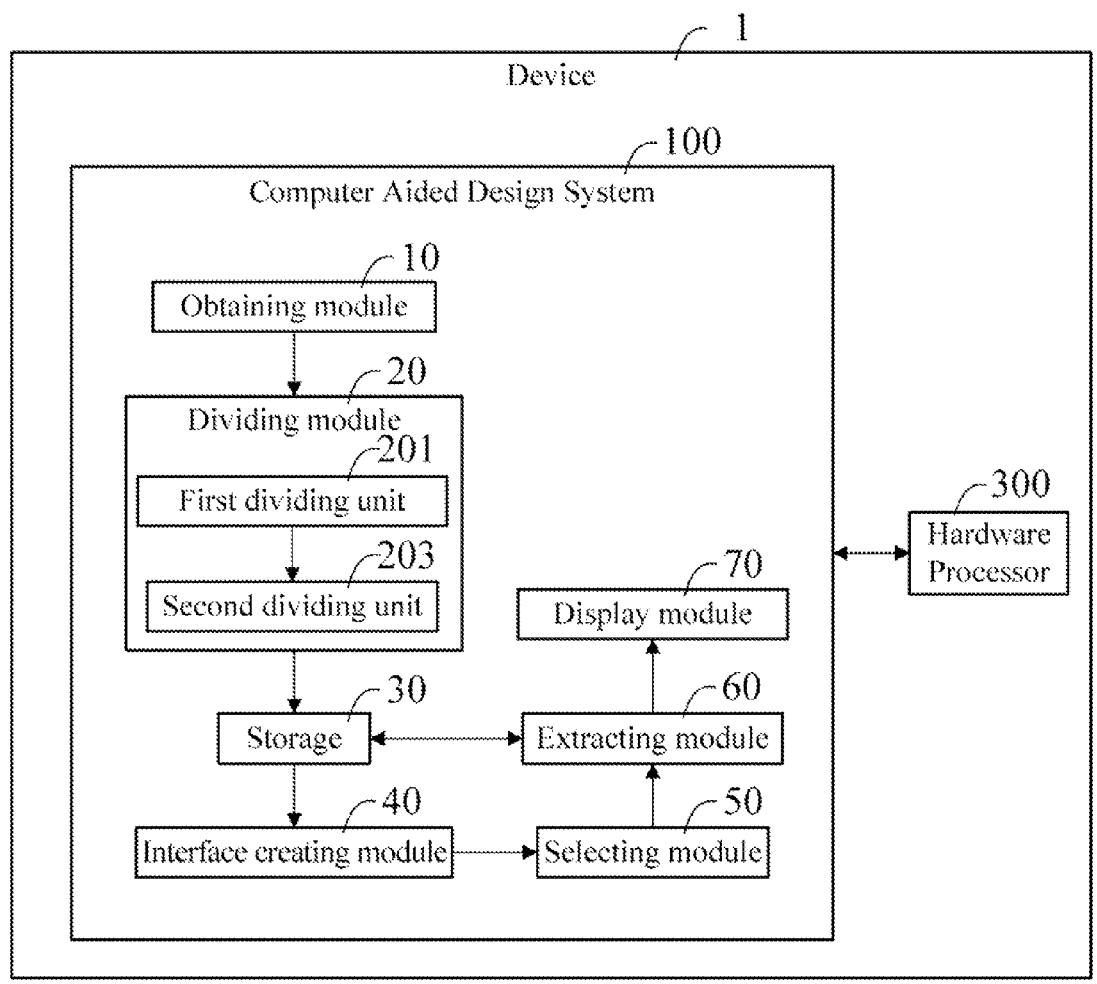
FIG. 1 is a block diagram of a computer aided design system in accordance with an embodiment.

Referring to FIG. 1, a device 1 such as a computer includes a computer aided design system 100 and a hardware processor 300. The computer aided design system 100 includes an obtaining module 10, a dividing module 20, a storage 30, an interface creating module 40, a selecting module 50, an extracting module 60, and a display module 70. In the embodiment, the computer aided design system 100 is used in a PCB layout system to select targets on different layers to check for discrepancies in a PCB layout diagram design. The targets may be electronic components, holes, and routes, on a PCB layout diagram design. Features of each target may include layer information for indicating the element mounted on, a name, a general function, a detail function, a dimension thereof, or an insertion time. The modules 10-20 and 40-70 may comprise computerized code in the form of one or more programs that are stored in the storage 30. The computerized code includes instructions that are executed by the at least one hardware processor 300 to provide functions for modules 10-70.

The hardware processor 300 executes one or more computerized code of the device 1 and other applications, to provide the functions of the device 1.

The obtaining module 10 is used for obtaining some features of all the targets on a PCB layout diagram design.

The dividing module 20 divides the targets into different groups according to a predetermined rule. The predetermined rule may be one common feature of the targets, or combination of more than one common feature of the targets. In some embodiment, the dividing module 20 may include a first dividing unit 201 and a second dividing unit 203.

Figure 2:
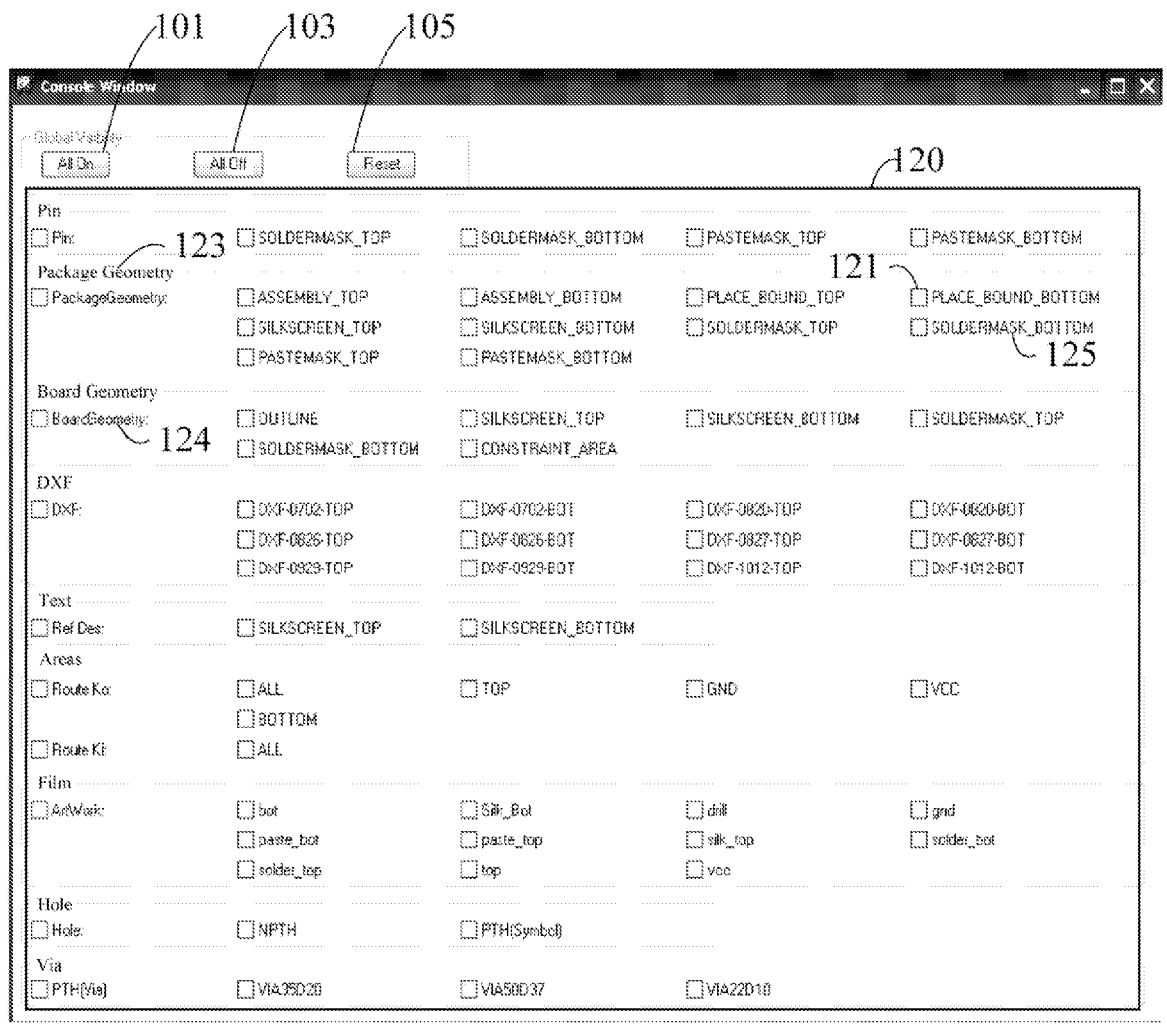
FIG. 2 is a schematic diagram showing a user interface displayed on the computer aided design system of FIG. 1.

The first dividing unit 201 is used for dividing the targets into different first level groups according to a first predetermined rule. The first predetermined rule in some embodiments may be targets having one common feature being divided into one first level group. In the embodiment, the first predetermined rule uses the general function as a common feature to divide the targets into different first level groups. Referring also to FIG. 2, the first level groups in some embodiments may include a package geometry group, a board geometry group, an area group, a text group, a DXF layer group, a film group, a pin group, a hole group, and a via group. Package geometry is a flexible and completed interface of an electronic component. Board geometry is a virtual board to explore geometric concepts of area and perimeter. An area is a region capable of inserting routes. A text is the area for inputting words. A DXF is a description layer describing shape, dimension and limition area of a board. A film is a gerber file for manufacturing a design into an actual board. A hole is exposed on all the sides of the whole PCB board and connects the different layers by using an electronic component. A via is exposed on all the sides of the PCB board and connects the different layers without an electronic component.

The second dividing unit 203 is used for dividing each first level group into different second level groups according to a second predetermined rule. The second predetermined rule in some embodiments may be targets in each first level group having one common feature or combination of more than one common feature except the common feature or features adopted by the first predetermined rule being divided into one second level group. For example, the pin group, one of the first level groups, is divided into second level groups according to the detail function and the layer information. In some embodiments, the pin group may include a soldermask_top group, soldermask_bottom group, pastemask_top group, and pastemask_bottom group. The area group may be divided into different second level groups according to the detail function. For example, the area group may include a Route Ko group and a Route Ki group. The Route Ko is a region where the route cannot be inserted. The Route Ki group is a region for inserting routes. The Route Ko group may be divided into a TOP group, a BOTTOM group, a GND group, a VCC group, and an ALL group according to the layer information. The DXF group may be divided into second level groups according to the insertion time and the detail function. The hole group may be divided into second level groups according to the detail function. For example, the hole group may include a plating through hole (pth) group and a non plating through hole (npth) group according to the detail function. The via group may be divided into second level groups according to the dimension.

The storage 30 is used for recording the relationship between the first level groups and the second level groups as a first table and the relationship between the second level groups and the targets as a second table. The first table and the second table connect with each other through the second level group. In the embodiment, the storage may be a memory system of the device 1, and also may be an external storage card, such as a smart media (SM) card, or secure digital (SD) card, for example.

An exemplary first table is shown as follows:

| First level group | Second level group |
|---|---|
| pin | soldermask_top |
| | soldermask_bottom |
| | pastemask_top |
| | pastemask_bottom |
| DXF | DXF-0702-TOP |
| | DXF-0702-BOT |
| | DXF-0820-TOP |
| | DXF-0820-BOT |
| hole | npth |
| | pth |
| via | VIA35D20 |
| | VIA50D37 |
| | VIA22D10 |

Referring to FIG. 2, the interface creating module 40 is used for creating a user interface 12 having group selection region corresponding to the groups divided by the dividing module. The user interface 12 is used for selecting at least one group according to a user's operation. In the embodiment, the user interface 12 includes a selection area 120 and a plurality of buttons. The selecting area 120 further includes checkboxes 121, first level group labels 123, first level group names 124 and second level group names 125. The first level group labels 123 are arranged in a column in the selecting area 120. The first level group names 124 and the corresponding second level group names 125 are arranged in rows in the corresponding group label column. The checkboxes 121 are respectively set in front of the first level group names 124 and second level group names 125. The user uses the checkbox to select the first level group name or the second group name. The user interface 12 may further include an all on button 101, an all off button 103, and a reset button 105. When one first level group is selected, all second level groups corresponding to the selected first level group are selected. When the all on button 101 is clicked, all the checkboxes in the selecting area 120 are selected. When the all off button 103 is clicked, all the checkboxes in the selecting area 120 are cancelled. When the reset button 105 is clicked, the selections are reset. In the embodiment, the displayed first level groups include the pin group, the package geometry group, the board geometry group, the DXF group, the text group, the area group, and the film group. In other embodiments, the way of the groups displayed on the screen can be customized by the user.

The selecting module 50 is used for selecting all targets in the selected group or groups.

The extracting module 60 is used for extracting the selected targets from the storage 30 according to the selected targets and sending the selected targets to the display module 70.

The display module 70 is used for displaying the selected targets on the screen of the device 1 simultaneously. In the embodiment, the selected targets are further highlighted on the screen of the device 1.

Figure 3:
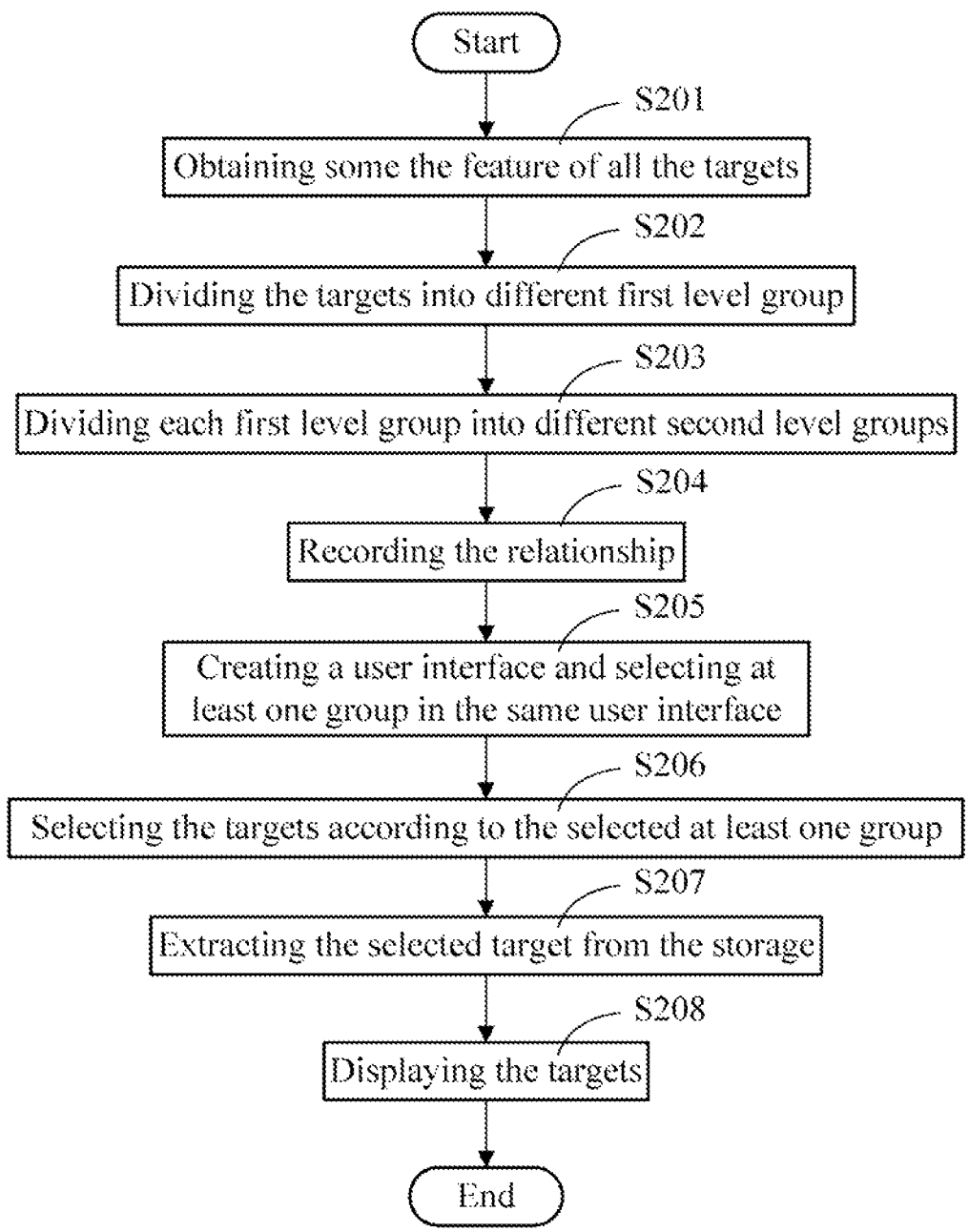
FIG. 3 is a flowchart of a selecting method in accordance with the embodiment.

Referring to FIG. 3, a flow chart of a selecting method used for selecting the targets on the different layer of a design is shown. The selecting method includes the following steps.

In step S201, the obtaining module obtains some the feature of all the targets on a design. In the embodiment, the targets may be electronic components, holes, and routes. Features of each target may include layer information for indicating the element mounted on, a name, a general function, a detail function, a dimension thereof, and an insertion time.

In step S202, the first dividing unit divides the targets into different first level groups according to a first predetermined rule. Referring again to FIG. 2, the first level groups in the embodiment may include a package geometry group, a board geometry group, an area group, a text group, a DXF layer group, a film group, a pin group, a hole group, and a via group.

In step S203, the second dividing unit divides each first level group targets into second level groups according to a second predetermined rule.

In step S204, the storage records the relationship between the first level group and the second level group as a first table and the relationship between the second level group and the feature of the targets as a second table. The first table and the second table connect with each other through the second level group.

In step S205, the interface creating module creates a user interface according to the groups divided by the dividing module and selects at least one group according to an operation of the user on the same user interface. When a first level group is selected, all the second level groups corresponding to the selected first group are selected. In the embodiment, the user interface 12 includes an all on button 101, an all off button 103, a reset button 105. When the all on button 101 is clicked, all the groups in the selecting area 120 are selected. When the all off button 103 is clicked, all the selection are cancelled. When the reset button 105 is clicked, all the selections in the selection area 120 are reset.

In step S206, the selecting module selects the targets on the different layers according to selected groups.

In step S207, the extracting module extracts the selected targets from the storage.

In step S208, the display module displays the selected targets on the screen of the device 1 simultaneously. In the embodiment, the selected targets are further highlighted.

In use, when a user selects the targets on the different layers, the targets are displayed in the user interface as a list, such that the selection operation becomes simpler and saves time.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A computer aided design system of a device with a screen used in a printed circuit board (PCB) layout system for selecting targets on different layers of a PCB layout design, the device comprising at least one hardware processor and a non-transitory storage; and the computer aided design system comprising one or more programs, the one or more programs stored in the non-transitory storage, executable by the at least one processor, the one or more programs comprising:

a dividing module adapted to divide the targets into different groups according to a predetermined rule, each group with a different label comprises a plurality of targets which are set on the different layers;

an interface creating module adapted to create a user interface displaying the different labels of the groups and select at least one label of the groups according to a user's operation on the same user interface;

a selecting module adapted to select the targets comprised in the selected at least one label of the groups; and a display module adapted to display the selected targets simultaneously on the screen.

2. The computer aided design system of claim 1, wherein the computer aided design system further comprises an obtaining module adapted to obtain some feature of the targets.

3. The computer aided design system of claim 2, wherein the dividing module further comprises a first dividing unit and a second dividing unit, the first dividing unit is used for dividing the targets into different first level groups according to a first predetermined rule, and the second dividing unit is used for dividing each first level group into different second level groups according to a second predetermined rule.

4. The computer aided design system of claim 3, wherein the first predetermined rule is having the targets with one common feature divided into a first level group.

5. The computer aided design system of claim 3, wherein the second predetermined rule is having the targets in each first level group divided into different second level groups with one common feature of or combination of more than one common features of the targets except the common feature adopted by the first predetermined rule.

6. The computer aided design system of claim 1, wherein the selected targets are highlighted displayed on a screen of the device.

7. The computer aided design system of claim 1, wherein the computer aided system further comprises an extracting module for extracting the selected targets from the non-transitory storage according to the selected groups and sending the selected targets to the display module.

8. The computer aided design system of claim 1, wherein the user interface comprises an all on button, an all off button, a reset button, and a selecting area.

9. The computer aided design system of claim 8, wherein the selecting area comprises the group labels, the group's labels are arranged in column in the selecting area.

10. The computer aided design system of claim 8, wherein the selecting area further comprises group's names and checkboxes, the group's name are arranged in rows in the corresponding group label column and a checkboxes is set in front of each group's name.

11. A selecting method for selecting targets on different layers of a PCB layout design in a computer aided design system, the method comprising:

dividing the targets into different groups according to a predetermined rule, each group with a different label comprises a plurality of targets which are set on the different layers;

creating a user interface displaying the different labels of the groups and selecting at least one label of the groups in the same user interface;

selecting the targets comprised in the selected at least one label of the groups; and displaying the selected targets simultaneously on a screen.

12. The method according to claim 11, wherein before the step of dividing the targets into groups according to a predetermined rule further comprising:

obtaining some features of targets on a PCB layout design.

13. The method according to claim 12, wherein the step of dividing the targets into groups according to a predetermined rule further comprising:

dividing the targets into different first level groups according to a first predetermined rule; and dividing each first level group into different second level groups according to a second predetermined rule.

14. The method according to claim 13, wherein the first predetermined rule is having the targets with one common feature divided into a first level group.

15. The method according to claim 14, wherein the first predetermined rule is having the targets in each first level group divided into different second level groups with one common feature of or combination of more than one common features of the targets except the common feature adopted by the first predetermined rule.

16. The method according to claim 13, wherein if one first level group is selected, second level groups corresponding to the selected first level groups are also selected.

17. The method according to claim 11, wherein further comprising a step of extracting the selected targets from a non-transitory storage.

18. The method according to claim 11, wherein the user interface comprises an all on button, an all off button, a reset button, and a selecting area.

19. The method according to claim 18, wherein the selecting area comprises the group labels, group's names, and checkboxes; the group's labels are arranged in column in the selecting area, the group's name are arranged in rows below the corresponding group label and a checkboxes is set in front of each group's name.

20. The method according to claim 11, wherein the selected targets are highlighted displayed on the screen of the device.

* * * * *